US012666870B2

(12) United States Patent
Jin et al.

(10) Patent No.: US 12,666,870 B2
(45) Date of Patent: Jun. 23, 2026

(54) WAFER LEVEL ULTRASONIC CHIP MODULE HAVING SUSPENSION STRUCTURE

(71) Applicants: J-METRICS TECHNOLOGY Co., Ltd., Taipei (TW); Peking University Shenzhen Graduate School, Shenzhen (CN)

(72) Inventors: Yu-Feng Jin, Shenzhen (CN); Sheng-Lin Ma, Shenzhen (CN); Qian-Cheng Zhao, Shenzhen (CN); Yi-Hsiang Chiu, Taipei City (TW); Huan Liu, Shenzhen (CN); Hung-Ping Lee, Taipei City (TW); Dan Gong, Shenzhen (CN)

(73) Assignee: SONICMEMS (ZHENGZHOU) TECHNOLOGY CO., LTD., Zhengzhou (CN)

( * ) Notice: Subject to any disclaimer, the term of this patent is extended or adjusted under 35 U.S.C. 154(b) by 952 days.

(21) Appl. No.: 17/945,697

(22) Filed: Sep. 15, 2022

(65) Prior Publication Data

US 2023/0014827 A1      Jan. 19, 2023

Related U.S. Application Data

(62) Division of application No. 16/274,456, filed on Feb. 13, 2019, now Pat. No. 11,478,822.

(30) Foreign Application Priority Data

Nov. 28, 2018     (CN) .......................... 201811429713.4

(51) Int. Cl.
*H10N 30/07*        (2023.01)
*B06B 1/06*        (2006.01)
(Continued)

(52) U.S. Cl.
CPC .......... *H10N 30/07* (2023.02); *B06B 1/0662* (2013.01); *H10N 30/02* (2023.02); *H10N 30/877* (2023.02); *H10N 30/88* (2023.02); *Y10T 29/42* (2015.01)

(58) Field of Classification Search
CPC .... H10N 30/07; H10N 30/2047; H10N 30/02; H10N 30/302; H10N 30/88; G06V 40/1306
See application file for complete search history.

(56) References Cited

U.S. PATENT DOCUMENTS

| | | | | |
|---|---|---|---|---|
| 6,089,701 A | * | 7/2000 | Hashizume | ............ B41J 2/1629 347/70 |
| 6,502,930 B1 | * | 1/2003 | Shimada | .............. B41J 2/14233 347/71 |

(Continued)

FOREIGN PATENT DOCUMENTS

| | | | | |
|---|---|---|---|---|
| CN | 111293210 A | * | 6/2020 | ......... G06V 40/1306 |
| CN | 112906442 A | * | 6/2021 | ......... G06V 40/1306 |

(Continued)

*Primary Examiner* — Pedro J Cuevas
(74) *Attorney, Agent, or Firm* — Muncy, Geissler, Olds & Lowe, P.C.

(57)      ABSTRACT

A wafer level ultrasonic chip module includes a substrate, a composite layer and a base material. The substrate has a through slot passing through an upper surface and a lower surface of the substrate. The composite layer includes an ultrasonic body and a protective layer. A lower surface of the ultrasonic body is exposed from the through slot. The protective layer covers the ultrasonic body and a partial upper surface of the substrate. The composite layer has a groove passing through an upper surface and a lower surface of the protective layer, and communicating with the through slot. Rhe ultrasonic body corresponds to the through slot. The base material covers the through slot, such that a space (Continued)

is formed among the through slot, the lower surface of the ultrasonic body and an upper surface of the base material.

6 Claims, 4 Drawing Sheets

(51) Int. Cl.
| | |
|---|---|
| *H10N 30/02* | (2023.01) |
| *H10N 30/87* | (2023.01) |
| *H10N 30/88* | (2023.01) |

(56) References Cited

U.S. PATENT DOCUMENTS

| | | | | |
|---|---|---|---|---|
| 7,045,935 | B2 * | 5/2006 | Matsuda | B41J 2/1646 |
| | | | | 310/363 |
| RE39,474 | E * | 1/2007 | Hashizume | B41J 2/1631 |
| | | | | 29/25.35 |
| 7,497,962 | B2 * | 3/2009 | Tokunaga | B41J 2/1639 |
| | | | | 216/27 |
| 11,075,072 | B2 * | 7/2021 | Jin | B24B 7/228 |
| 11,460,341 | B2 * | 10/2022 | Jin | H10N 30/063 |
| 11,806,751 | B2 * | 11/2023 | Chiu | B06B 1/0622 |
| 12,199,081 | B2 * | 1/2025 | Liu | G06V 40/1306 |
| 2004/0194309 | A1 * | 10/2004 | Tokunaga | B41J 2/1628 |
| | | | | 29/890.1 |
| 2006/0027529 | A1 * | 2/2006 | Tokunaga | B41J 2/1626 |
| | | | | 216/27 |
| 2018/0154635 | A1 | 6/2018 | Nakakubo | |
| 2020/0164406 | A1 * | 5/2020 | Jin | H10N 30/07 |
| 2020/0179979 | A1 | 6/2020 | Jin et al. | |
| 2020/0191646 | A1 * | 6/2020 | Jin | B06B 3/00 |
| 2021/0013026 | A1 * | 1/2021 | Jin | H01L 22/12 |
| 2021/0170448 | A1 * | 6/2021 | Chiu | G06V 40/1329 |
| 2022/0310573 | A1 * | 9/2022 | Liu | H01L 25/167 |
| 2023/0014827 | A1 * | 1/2023 | Jin | B06B 1/0662 |
| 2024/0009702 | A1 * | 1/2024 | Chiu | H10N 30/883 |
| 2024/0009703 | A1 * | 1/2024 | Chiu | H10N 30/06 |

FOREIGN PATENT DOCUMENTS

| | | | | | |
|---|---|---|---|---|---|
| CN | 111403591 | B * | 4/2023 | | H10N 30/304 |
| CN | 111293210 | B * | 1/2024 | | H10N 30/80 |
| TW | I702741 | B * | 8/2020 | | |
| TW | 202123498 | A * | 6/2021 | | G06V 40/1329 |
| TW | I729605 | B * | 6/2021 | | G06V 40/1329 |

* cited by examiner

WAFER LEVEL ULTRASONIC CHIP MODULE HAVING SUSPENSION STRUCTURE

CROSS-REFERENCE TO RELATED APPLICATION

This application is a divisional application of Ser. No. 16/274,456 filed on Feb. 13, 2019, and claims priority under 35 U.S.C. § 119(a) to Patent Application No. 201811429713.4 filed in China, P. R. C. on Nov. 28, 2018, the entire contents of which are hereby incorporated by reference.

BACKGROUND

Technical Field

The present invention relates to an ultrasonic transmission technology, and in particular, to a wafer level ultrasonic chip module.

Related Art

With the development of technologies, smart electronic devices such as mobile phones, personal laptops or tablets have become essential tools in life. The public has become accustomed to storing important information or personal data inside smart electronic devices. The functions or applications of these smart electronic devices are also becoming more and more personalized. In order to avoid the situations such as loss or misappropriation of important information, smart electronic devices have been widely used in fingerprint recognition to identify their users.

At present, an ultrasonic fingerprint recognition technology has been applied to smart electronic devices. Generally, when an ultrasonic module is integrated into a smart electronic device, a finger touches an upper cover of the ultrasonic module or a screen protection layer of the smart electronic device, and the ultrasonic module sends an ultrasonic signal to the finger and is capable of recognizing a fingerprint by receiving the intensity of the ultrasonic signal reflected back from peaks and troughs of the fingerprint. However, the ultrasonic signal of the ultrasonic module can be transmitted to an area not in contact with the finger by means of a medium. Therefore, the reflected ultrasonic signal received by the ultrasonic module is not necessarily reflected by the finger, so that the fingerprint is less likely to be recognized.

SUMMARY

An embodiment of the present invention provides a wafer level ultrasonic chip module having a suspension structure, which includes a substrate, a composite layer and a base material. The substrate has a through slot, which passes through an upper surface of the substrate and a lower surface of the substrate. The composite layer is located on the substrate. The composite layer includes an ultrasonic body and a protective layer. The ultrasonic body is located on the upper surface of the substrate, and a lower surface of the ultrasonic body is exposed from the through slot. The protective layer covers the ultrasonic body and a partial upper surface of the substrate. The composite layer has a groove. The groove passes through an upper surface of the protective layer and a lower surface of the protective layer, and communicates with the through slot, the groove surrounds a portion of the periphery of the ultrasonic body, and the ultrasonic body corresponds to the through slot. The base material is located on the lower surface of the substrate and covers the through slot, such that a space is formed among the through slot, the lower surface of the ultrasonic body and an upper surface of the base material, and the space communicates with the groove.

In summary, an embodiment of the present invention provides a wafer level ultrasonic chip module. A groove is formed in a portion of the periphery of an ultrasonic body, a space is formed below the ultrasonic body, and the space communicates with the groove to form an overall gap. Accordingly, the transmission speed of an ultrasonic signal transmitted in the direction of an upper surface of the ultrasonic body and the transmission speed of an ultrasonic signal transmitted in the direction of a base material are different by the design of the overall gap so as to distinguish the ultrasonic signals in different directions. By filtering the ultrasonic signal transmitted in the direction of the base material, a fingerprint on a protective layer can be recognized by receiving the ultrasonic signal transmitted in the direction of the upper surface of the ultrasonic body, and an impact on the recognition of a fingerprint pattern caused by receiving a second ultrasonic signal is avoided, thereby improving the accuracy of fingerprint recognition. In another embodiment of the present invention, a conducting material is disposed in an opening of the protective layer, and since the ultrasonic signal can be better transmitted to a finger by means of the conducting material, the ultrasonic signals in different directions can be better distinguished, thereby improving the accuracy of fingerprint recognition.

DETAILED DESCRIPTION

Figure 1:
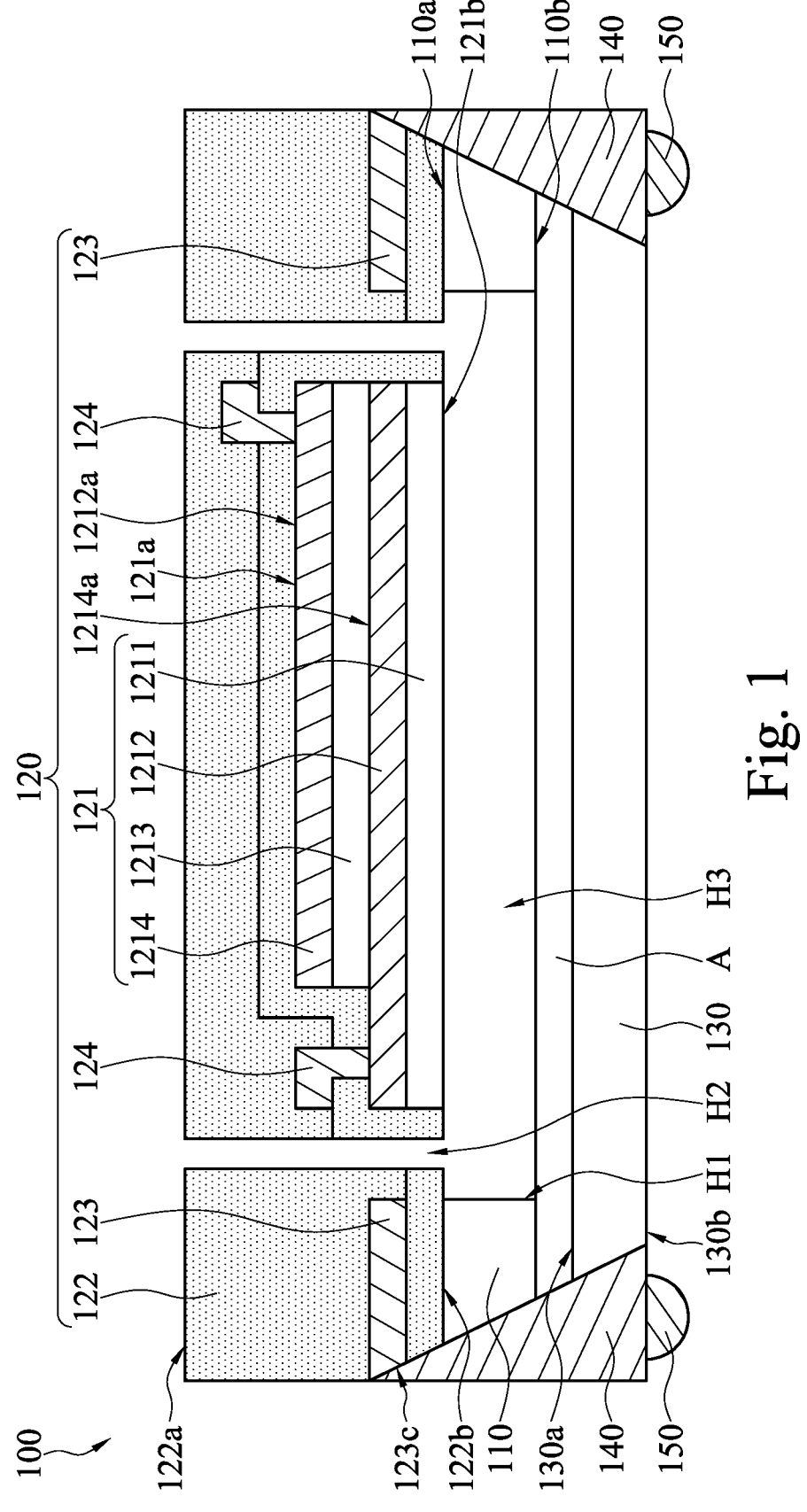
FIG. 1 is a schematic structural diagram of a wafer level ultrasonic chip module according to an embodiment of the present invention.

FIG. 1 is a schematic structural diagram of a wafer level ultrasonic chip module according to an embodiment of the present invention. Referring to FIG. 1, a wafer level ultrasonic chip module 100 includes a substrate 110, a composite layer 120 and a base material 130. The composite layer 120 is located on an upper surface 110a of the substrate 110, and the base material 130 is bonded to a lower surface 110b of the substrate 110.

The substrate 110 has a through slot H1, and the through slot H1 passes through the upper surface 110a and the lower surface 110b of the substrate 110. The substrate 110 is used for carrying the composite layer 120. In an implementation, the substrate 110 may be a silicon substrate, a glass substrate, a sapphire substrate, a plastic substrate or the like.

The composite layer 120 is disposed on the substrate 110. The composite layer 120 includes an ultrasonic body 121 and a protective layer 122. The ultrasonic body 121 is located on the upper surface 110a of the substrate 110, and at least a portion of a lower surface 121b of the ultrasonic body 121 is exposed from the through slot H1. The protective layer 122 covers the ultrasonic body 121 and a partial upper surface 110a of the substrate 110. The composite layer 120 has a groove H2, and the groove H2 passes through an upper surface 122a of the protective layer 122 and a lower surface 122b of the protective layer 122. The groove H2 communicates with the through slot H1. The ultrasonic body 121 corresponds to the through slot H1, the groove H2 surrounds a portion of the periphery of the ultrasonic body 121, and another portion (not surrounded by the groove H2) of the periphery of the ultrasonic body 121 is connected with the protective layer 122. Hereupon, the groove H2 can prevent an ultrasonic signal of the ultrasonic body 121 and signals of other electronic components (not shown) from interfering with each other. The ultrasonic body 121 corresponds to the through slot H1, and in other words, the ultrasonic body 121 is located on the through slot H1 and is connected to the protective layer 122 in a suspension manner. The projection of the ultrasonic body 121 and the projection of the through slot H1 overlap in a vertical projection direction of the substrate 110. In an implementation, the material of the protective layer 122 is, for example but not limited to, silicon dioxide (PE-SiO2).

The base material 130 is located on the lower surface 110b of the substrate 110 and covers the through slot H1, such that a space H3 is formed among the through slot H1, the lower surface 121b of the ultrasonic body 121 and an upper surface 130a of the base material 130, and the space H3 communicates with the groove H2. In an implementation, the base material 130 may be disposed on the lower surface 110b of the substrate 110 through an adhesive material A. In an implementation, the adhesive material A may be a double-sided adhesive tape, viscous ink or viscous paint. Hereupon, the ultrasonic body 121 is suspended in the space H3, such that the ultrasonic body 121 is easily oscillated. In other words, the projection of the ultrasonic body 121 and the projection of the space H3 overlap in a vertical projection direction of the base material 130, and the lower surface 121b of the ultrasonic body 121 is not in contact with the upper surface 130a of the base material 130.

Accordingly, a first ultrasonic signal transmitted from the ultrasonic body 121 in the direction of the upper surface 121a of the ultrasonic body 121 is substantially transmitted via a solid medium (protective layer 122); and a second ultrasonic signal transmitted from the ultrasonic body 121 in the direction of the base material 130 is substantially transmitted via a gaseous medium and/or a solid medium (space H3 and/or base material 130, etc.). That is to say, the first ultrasonic signal is transmitted via the same type of medium (solid medium), and the second ultrasonic signal is transmitted via different types of media (gaseous medium and solid medium). Accordingly, the speed of the first ultrasonic signal which is reflected and returned by a finger is different from the speed of the second ultrasonic signal which passes through air in the space H3 and is reflected and returned by the base material 130. Hereupon, the overall gap is designed such that the transmission speeds of the first ultrasonic signal and the second ultrasonic signal are different, so that the second ultrasonic signal can be distinguished and filtered, and only the first ultrasonic signal is received. Therefore, the fingerprint of the finger located on the upper surface of the protective layer 122 can be recognized by the first ultrasonic signal, and the interference of the second ultrasonic signal can be avoided, thereby improving the accuracy of fingerprint recognition. In addition, since the groove H2 surrounds a portion of the periphery of the ultrasonic body 121, the groove H2 can prevent an ultrasonic signal of the ultrasonic body 121 and signals of other electronic components from interfering with each other, thereby better improving the accuracy of fingerprint recognition.

Figure 2:
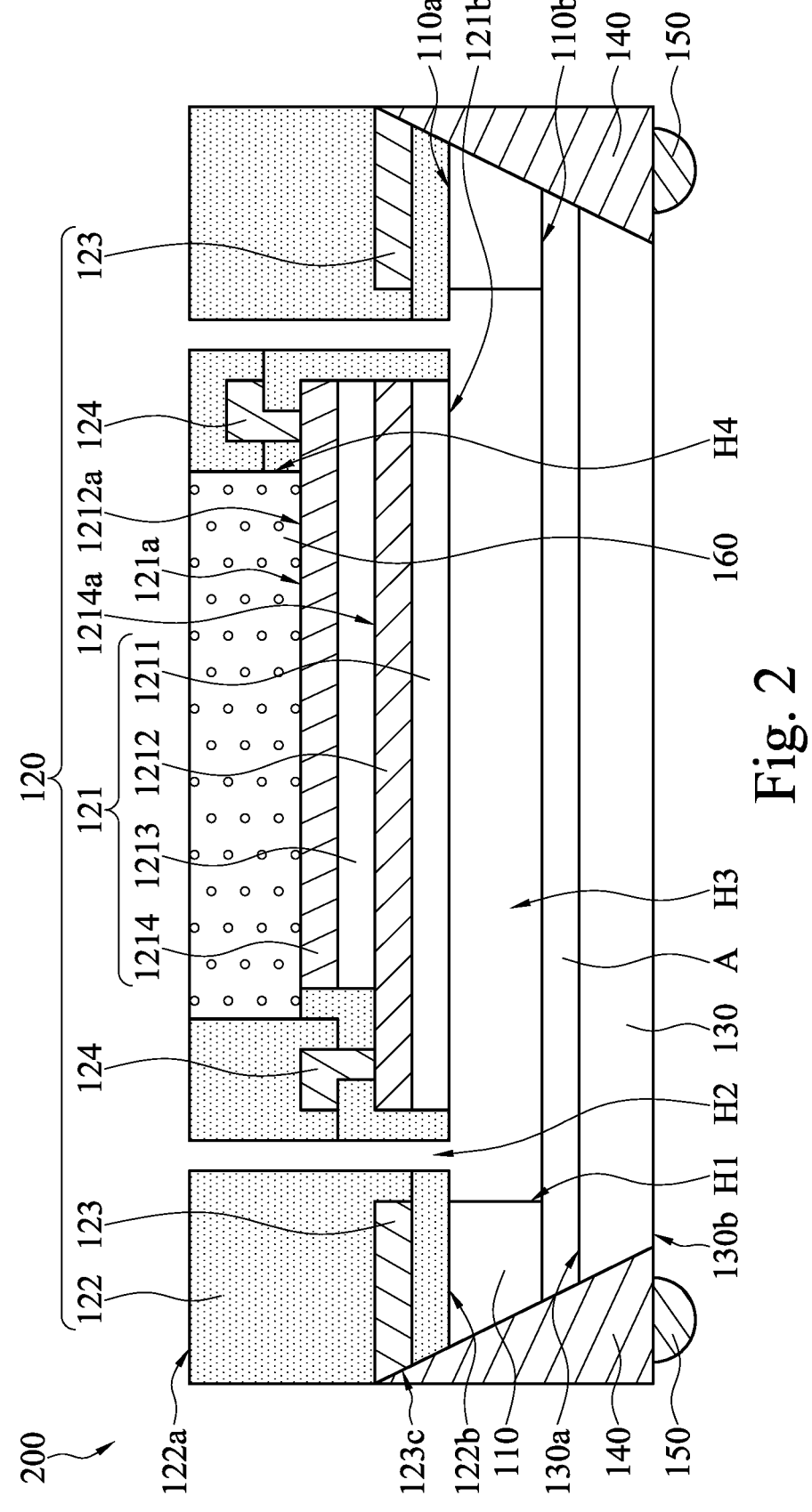
FIG. 2 is a schematic structural diagram of a wafer level ultrasonic chip module according to another embodiment of the present invention.

In another embodiment, as shown in FIG. 2, the protective layer 122 has an opening H4, the opening H4 extends from the upper surface 122a of the protective layer 122 to the upper surface 121a of the ultrasonic body 121, and exposes a partial upper surface 121a of the ultrasonic body 121. A wafer level ultrasonic chip module 200 further includes a conducting material 160, and the conducting material 160 is located in the opening H4 and is in contact with the upper surface 121a of the ultrasonic body 121. In an implementation, the conducting material 160 may be polydimethylsiloxane (PDMS). The ultrasonic signal may be better transmitted to the finger by means of the conducting material 160. Accordingly, a first ultrasonic signal transmitted from the ultrasonic body 121 in the direction of the upper surface 121a of the ultrasonic body 121 is substantially transmitted via a solid medium (protective layer 122, conducting material 160, etc.); and a second ultrasonic signal transmitted from the ultrasonic body 121 in the direction of the base material 130 is substantially transmitted via a gaseous medium and/or a solid medium (base material 130, space H3, etc.). That is to say, the first ultrasonic signal is transmitted via the same type of medium (solid medium), and the second ultrasonic signal is transmitted via different types of media (gaseous medium and solid medium). Since the ultrasonic signal can be better transmitted to the finger by means of the conducting material 160, the second ultrasonic signal can be distinguished and filtered, and only the first ultrasonic signal is received, thereby improving the accuracy of fingerprint recognition.

Figure 3:
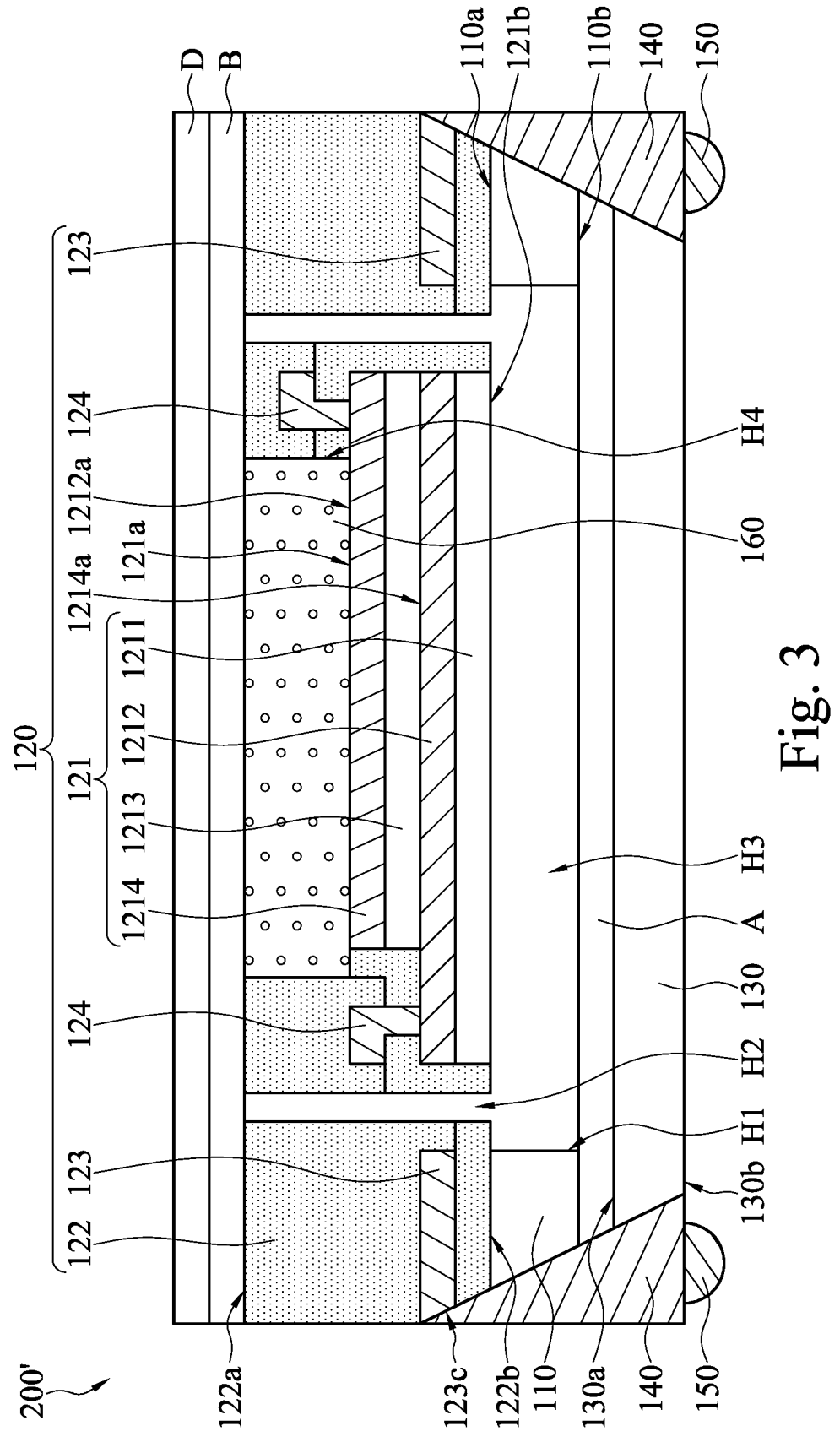
FIG. 3 is a schematic structural diagram of a wafer level ultrasonic chip module according to yet another embodiment of the present invention.

In a variant embodiment, as shown in FIG. 3, a wafer level ultrasonic chip module 200' may further include an upper cover 270. The upper cover 270 may cover a conducting material 160 of the wafer level ultrasonic chip module 200' and cover a groove H2. However, in another variant embodiment, the wafer level ultrasonic chip module 100 may further include an upper cover, and the upper cover may cover the groove H2 (not shown) of the wafer level ultrasonic chip module 100.

In an embodiment, as shown in FIG. 1, FIG. 2 and FIG. 3, the ultrasonic body 121 includes a first piezoelectric layer 1211, a first electrode 1212, a second piezoelectric layer 1213 and a second electrode 1214. The first piezoelectric layer 1211 is located on the substrate 110, the first electrode 1212 is located on the first piezoelectric layer 1211, the second piezoelectric layer 1213 is located on the first electrode 1212, and the second electrode 1214 is located on the second piezoelectric layer 1213. The second piezoelectric layer 1213 and the second electrode 1214 do not cover a partial upper surface 1212a of the first electrode 1212. That is to say, the partial upper surface 1212a of the first electrode 1212 is exposed from the second piezoelectric layer 1213 and the second electrode 1214. In an implementation, the materials of the first piezoelectric layer 1211 and the second piezoelectric layer 1213 are, for example but not limited to, piezoelectric materials such as aluminum nitride (AlN), zinc oxide (ZnO), or lead zirconate titanate (PZT). In an implementation, the materials of the first electrode 1212 and the second electrode 1214 are, for example but not limited to, conductive materials such as aluminum (Al), tungsten (W), molybdenum (Mo), platinum (Pt) and gold (Au).

In an embodiment, as shown in FIG. 1, FIG. 2 and FIG. 3, the composite layer 120 further includes a circuit layer 123 and two electrode circuits 124. The protective layer 122 wraps the circuit layer 123 and exposes a side surface of the circuit layer 123 (as shown in FIG. 1), so that the circuit layer 123 may be electrically connected with an external circuit. The two electrode circuits 124 are respectively located on the partial upper surface 1212*a* of the first electrode 1212 and a partial upper surface 1214*a* of the second electrode 1214, and the two electrode circuits 124 are wrapped by the protective layer 122. In an implementation, the two electrode circuits 124 may be electrically connected with at least a portion of the circuit layer 123 according to the overall electrical connection requirement. Hereupon, the circuit layer 123 may transmit electrical signals of the two electrode circuits 124 and the ultrasonic body 121 to the outside. In an implementation, the circuit layer may be a circuit electrically connected between the ultrasonic body 121 and/or other electronic components, such as circuit wires and conductive pads. In another implementation, the circuit layer 123 may be other electronic components. In an implementation, the materials of the circuit layer 123 and the two electrode circuits 124 may be copper aluminide (AlCu).

In an embodiment, as shown in FIG. 1, FIG. 2 and FIG. 3, the wafer level ultrasonic chip module 100 includes a conductor layer 140 and at least one pad 150. The conductor layer 140 is located on a side surface 123*c* of the circuit layer 123. In an implementation, the conductor layer 140 may be further located on the side surface 123*c* of the circuit layer 123 and extend to a lower surface 130*b* of the base material 130, and the conductor layer 140 is electrically connected with the side surface 123*c* of the circuit layer 123 that is exposed from the protective layer 122. The pad 150 is located on the conductor layer 140. Hereupon, the circuit layer 123 may be electrically connected with the pad 150 by means of the conductor layer 140, so that components (such as the ultrasonic body 121 and/or other electronic components) may be electrically connected with external circuits. In an implementation, the pad 150 may be a solder ball or a bump.

Figure 4:
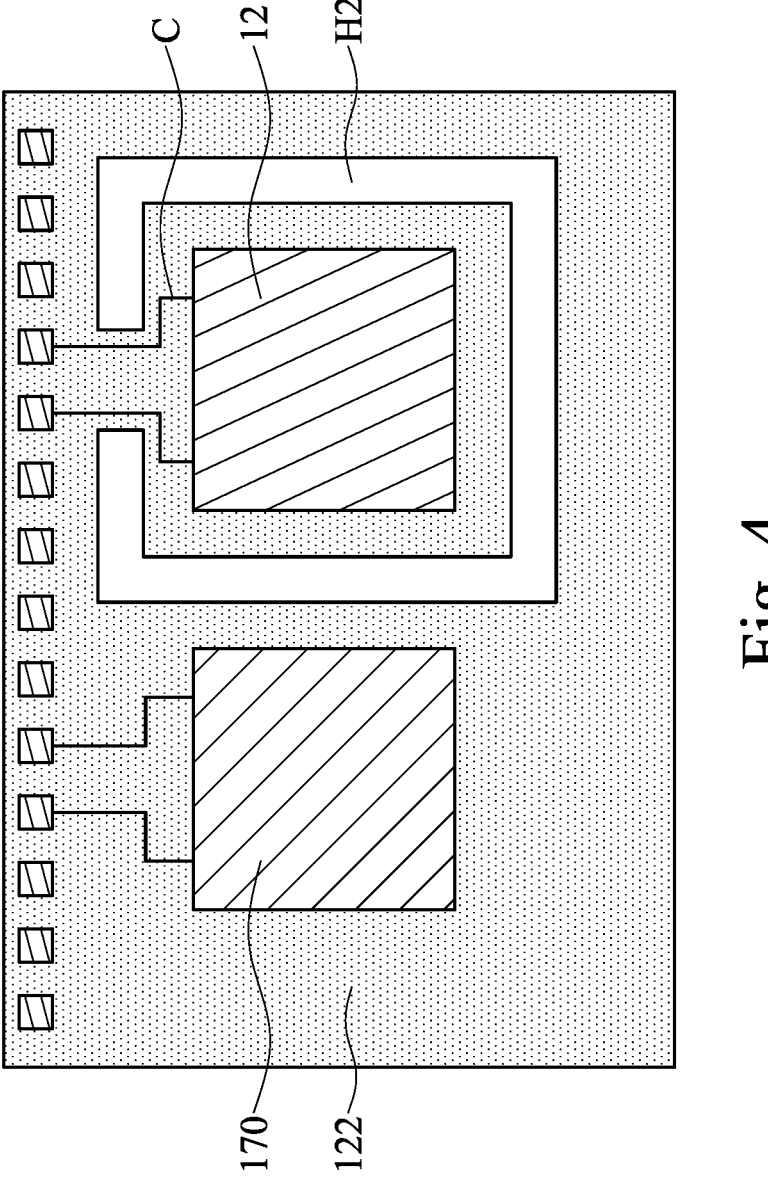
FIG. 4 is a schematic top view of a wafer level ultrasonic chip module according to an embodiment of the present invention.

FIG. 4 is a schematic top view of a wafer level ultrasonic chip module according to an embodiment of the present invention. Referring to FIG. 4, the wafer level ultrasonic chip module 100 or 200 may further include another ultrasonic component 170. The ultrasonic body 121 is surrounded by the groove H2 and connected, through the protective layer 122 and/or a circuit wire C, with the protective layer 122 through which the groove H2 does not pass, so as to be suspended over the space H3. An ultrasonic component 160 is not surrounded by the groove H2 and not suspended over the space H3. Hereupon, in an embodiment, the wafer level ultrasonic chip module 100 or 200 may be used as an acceleration sensor. When the wafer level ultrasonic chip module 100 or 200 is attached to an object to be measured and the object to be measured has not moved or rotated, the ultrasonic body 121 and the ultrasonic component 160 respectively transmit ultrasonic signals. When the object to be measured moves or rotates, since the ultrasonic body 121 is suspended over the space H3, the ultrasonic body 121 is shaken by a force to cause deviation from an original position. Hereupon, the ultrasonic body 121 and the ultrasonic component 160 respectively receive the reflected ultrasonic signals at different times, and the acceleration speed of the object to be measured can be obtained.

In another embodiment, the wafer level ultrasonic chip module 100 or 200 may be used as a level. The wafer level ultrasonic chip module may further include an upper cover, where the upper cover may cover the groove H2 (not shown) of the wafer level ultrasonic chip module 100, and may also cover the conducting material 160 of the wafer level ultrasonic chip module (such as the wafer level ultrasonic chip module 200' as shown in FIG. 3). By attaching the wafer level ultrasonic chip module 100 or 200 to the object to be measured, when the object to be measured is horizontally inclined, the ultrasonic body 121 and the ultrasonic component 160 receive ultrasonic signals reflected by the upper cover at different distances, which can determine whether the object to be measured is horizontally inclined.

In summary, an embodiment of the present invention provides a wafer level ultrasonic chip module. A groove is formed in a portion of the periphery of an ultrasonic body, a space is formed below the ultrasonic body, and the space communicates with the groove to form an overall gap. Accordingly, the transmission speed of an ultrasonic signal transmitted in the direction of an upper surface of the ultrasonic body and the transmission speed of an ultrasonic signal transmitted in the direction of a base material are different by the design of the overall gap so as to distinguish the ultrasonic signals in different directions. By filtering the ultrasonic signal transmitted in the direction of the base material, a fingerprint on a protective layer can be recognized by receiving the ultrasonic signal transmitted in the direction of the upper surface of the ultrasonic body, and an impact on the recognition of a fingerprint pattern caused by receiving a second ultrasonic signal is avoided, thereby improving the accuracy of fingerprint recognition. In another embodiment of the present invention, a conducting material is disposed in an opening of the protective layer, and since the ultrasonic signal can be better transmitted to a finger by means of the conducting material, the ultrasonic signals in different directions can be better distinguished, thereby improving the accuracy of fingerprint recognition.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A wafer level ultrasonic chip module having a suspension structure, comprising:

a substrate comprising a through slot, the through slot passing through an upper surface of the substrate and a lower surface of the substrate;

a composite layer located on the substrate, the composite layer comprising an ultrasonic body and a protective layer, wherein the ultrasonic body is located on the upper surface of the substrate and a lower surface of the ultrasonic body is exposed from the through slot, the protective layer covers the ultrasonic body and a partial upper surface of the substrate, the composite layer has a groove, the groove passes through an upper surface of the protective layer and a lower surface of the protective layer, and communicates with the through slot, the groove surrounds a portion of the periphery of the ultrasonic body, and the ultrasonic body corresponds to the through slot; and a base material located on the lower surface of the substrate and covering the through slot, such that a space is formed among the through slot, the lower surface of the ultrasonic body and an upper surface of the base material, and the space communicates with the groove.

2. The wafer level ultrasonic chip module having a suspension structure according to claim 1, wherein the ultrasonic body comprises:

a first piezoelectric layer located on the substrate;

a first electrode located on the first piezoelectric layer;

a second piezoelectric layer located on the first electrode; and a second electrode located on the second piezoelectric layer, wherein the second piezoelectric layer and the second electrode do not cover a partial upper surface of the first electrode.

3. The wafer level ultrasonic chip module having a suspension structure according to claim 2, wherein the composite layer further comprises a circuit layer and two electrode circuits, the protective layer wraps the circuit layer and exposes a side surface of the circuit layer, the protective layer wraps the two electrode circuits, the two electrode circuits are located on the partial upper surface of the first electrode and a partial upper surface of the second electrode respectively, and the two electrode circuits are electrically connected with the first electrode and the second electrode respectively.

4. The wafer level ultrasonic chip module having a suspension structure according to claim 3, further comprising a conductor layer and at least one pad, wherein the conductor layer is located from the side surface of the circuit layer to a lower surface of the base material, and the at least one pad is located on the conductor layer.

5. The wafer level ultrasonic chip module having a suspension structure according to claim 1, wherein the ultrasonic body is located on the space and connected to the protective layer in a suspension manner, and the projection of the ultrasonic body and the projection of the space overlap in a vertical projection direction of the base material.

6. The wafer level ultrasonic chip module having a suspension structure according to claim 1, wherein the protective layer comprises an opening, a partial upper surface of the ultrasonic body is exposed from the opening, the wafer level ultrasonic chip module further comprises a conducting material, and the conducting material is located in the opening and is in contact with the upper surface of the ultrasonic body.

* * * * *